(12) United States Patent
Peralta et al.

(10) Patent No.: US 8,803,637 B1
(45) Date of Patent: Aug. 12, 2014

(54) TERAHERTZ METAMATERIALS

(75) Inventors: Xomalin Guaiuli Peralta, Albuquerque, NM (US); Igal Brener, Albuquerque, NM (US); John O'Hara, Los Alamos, NM (US); Abul Azad, Los Alamos, NM (US); Evgenya Smirnova, Los Alamos, NM (US); John D. Williams, Decatur, AL (US); Richard D. Averitt, Newton, MA (US)

(73) Assignee: Sandia Corporation, Albuquerque, NM (US)

( * ) Notice: Subject to any disclaimer, the term of this patent is extended or adjusted under 35 U.S.C. 154(b) by 1685 days.

(21) Appl. No.: 12/262,422

(22) Filed: Oct. 31, 2008

(51) Int. Cl.
*H01P 7/10* (2006.01)
*H01P 7/08* (2006.01)

(52) U.S. Cl.
CPC . *H01P 7/082* (2013.01); *H01P 7/10* (2013.01)
USPC .......................................... 333/219; 333/204

(58) Field of Classification Search
USPC ......................................................... 333/219
See application file for complete search history.

(56) References Cited

U.S. PATENT DOCUMENTS

| | | | |
|---|---|---|---|
| 2004/0066251 A1* | 4/2004 | Eleftheriades et al. | 333/117 |
| 2007/0014006 A1* | 1/2007 | Tanaka et al. | 359/487 |
| 2007/0077691 A1* | 4/2007 | Watanabe | 438/149 |
| 2007/0237478 A1* | 10/2007 | D'Aguanno et al. | 385/129 |
| 2007/0262834 A1* | 11/2007 | Albacete et al. | 333/204 |

OTHER PUBLICATIONS

Abul K. Azad, et al, Transmission Properties of Terahertz Pulses through Subwavelength Double Split-ring Resonators, Optics Letters/vol. 31, No. 5/Mar. 1, 2006.
J. D. Baena, et al, Electrically Small Isotropic Three-Dimensional Magnetic esonators for Metamaterial Design, Applied Physical Letters 88, 134108 (2006).
C. Enkrich, et al, Magnetic Metamaterials at Telecommunication and Visible Frequencies, Physical Review Letters PRL 95, 203901 (2005).
Bradley Ferguson et al, Materials for Terahertz Science and Technology, Review Article, 2002 Nature Publishing Group.
Philippe Gay-Balmaz et al, Electromagnetic Resonances in Individual and Coupled Split-Ring Resonators, Journal of Applied Physics, vol. 92, No. 5, Sep. 1, 2002.
N. Katsarakis, et al, Magnetic Response of Split-Ring Resonators in the Far-Infrared Frequency Regime, Optics Letters/vol. 30, No. 11/Jun. 1, 2005.

(Continued)

*Primary Examiner* — Stephen Jones
*Assistant Examiner* — Scott S Outten
(74) *Attorney, Agent, or Firm* — Kevin W. Bieg (57) ABSTRACT

Terahertz metamaterials comprise a periodic array of resonator elements disposed on a dielectric substrate or thin membrane, wherein the resonator elements have a structure that provides a tunable magnetic permeability or a tunable electric permittivity for incident electromagnetic radiation at a frequency greater than about 100 GHz and the periodic array has a lattice constant that is smaller than the wavelength of the incident electromagnetic radiation. Microfabricated metamaterials exhibit lower losses and can be assembled into three-dimensional structures that enable full coupling of incident electromagnetic terahertz radiation in two or three orthogonal directions. Furthermore, polarization sensitive and insensitive metamaterials at terahertz frequencies can enable new devices and applications.

22 Claims, 10 Drawing Sheets

(56) References Cited

OTHER PUBLICATIONS

Michael C. Martin, et al, Fabrication and Optical Measurements of Nanoscale Meta-Materials: Terahertz and Beyond, Novel Devices and Components 0-7803-9348—Jan. 5, 2005 IEEE.

John F. O'Hara, et al, Enhanced Terahertz Detection Via ErAs: GaAs nanoisland Superlattices, Applied Physics Letters 88, 251119 (2006).

W. J. Padilla, et al, Electrically Resonant Terahertz Metamaterials: Theoretical and Experimental Investigations, Physical Review B 75, (2007).

W. J. Padilla, et al, Dynamical Electric and Magnetic Metamaterial Responseat Terahertz Frequencies, Physical Review Letters PRL 96, 107401 (2006.

J. B. Pendry, et al, Magnetism from Conductors and Enhanced Nonlinear Phenomena, IEEE Transactions on Microwave Theory and Techniques, vol. 47, No. 11, Nov. 1999.

J. B. Pendry, et al, Controlling Electromagnetic Fields, Jun. 23, 2006, vol. 312, Science www.sciencemag.org.

X. G. Peralta, et al, THz Polarimetric Metamaterials, 2008 Optical Society of America.

R. A. Shelby, et al, Experimental Verification of a Negative Index of Refraction, Science 292, 77 (2001.

D. R. Smith, et al, Composite Medium with Simultaneously Negative Permeability and Permittivity, vol. 84, No. 18, May 1, 2000.

D. R. Smith, et al, Metamaterials and Negative Refractive Index, Science 305, 788 (2004).

M. C. K. Wiltshire, et al, Microstructured Magnetic Materials for RF Flux Guides in Magnetic Resonance Imaging, Science 291, 849 (2001).

Xin-Long Xu, Bianisotropic Response of Microfabricated Metamaterials in the Terahertz Region, J. Opt. Soc. Am. B/vol. 23, No. 6/Jun. 2006.

T. J. Yen, et al, Terahertz Magnetic Response from Artificial Materials, Science 303, 1494 (2004).

* cited by examiner

TERAHERTZ METAMATERIALS

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to terahertz radiation technology and, in particular, to terahertz metamaterials.

BACKGROUND OF THE INVENTION

Terahertz (THz) technologies utilize electromagnetic radiation generally in the frequency range between 100 GHz and 10 THz (i.e., wavelengths of 3 mm to 30 μm, energies of 0.4 to 40 meV, or equivalent blackbody radiation temperatures of 5 K to 500 K). Many non-metallic materials that are visually opaque are partially transparent or exhibit molecular resonances in the terahertz region. Therefore, terahertz technologies have many potential applications in diverse fields, including molecular spectroscopy, space and atmospheric sciences, plasma physics, biology, medical imaging, remote sensing, and communications. In particular, the terahertz region of the electromagnetic spectrum offers considerable promise for covert communications, spectroscopic imaging of illicit and hazardous materials, and chemical and biological sensing. See B. Ferguson and X-C Zhang, *Nature Materials* 1, 26 (2002).

However, lying in the "terahertz gap" between the infrared and microwave regions of the electromagnetic spectrum, terahertz technologies have not been adequately developed to meet the requirements of many of the potential applications. Passive and active devices operating at terahertz frequencies are currently a challenge, and a promising emerging technology for such devices is optical metamaterials. Metamaterials are artificially structured materials in which both the electric permittivity E and the magnetic permeability μ are tunable. Such materials can possess a negative index of refraction and are sometimes referred to as "left-handed," when the wave vector is antiparallel to the usual right-handed cross product of the electric and magnetic fields characteristic of naturally occurring materials. Metamaterials have electromagnetic properties that are difficult or impossible to achieve with conventional right-handed materials, the most notable being the negative refractivity. These unconventional properties suggest a number of unique applications, including compact aberration-free lenses, subwavelength imaging, and cloaking. However, although materials with negative electric permittivity are readily available at low frequencies, including metals below the ultraviolet region and doped semiconductors in the terahertz and infrared regions, existing materials with negative magnetic permeability typically lose their magnetic activity at much lower frequencies. Therefore, until recently, artificial metamaterials having both negative permittivity and negative permeability in the same frequency range were difficult to realize in practice.

Figure 1:
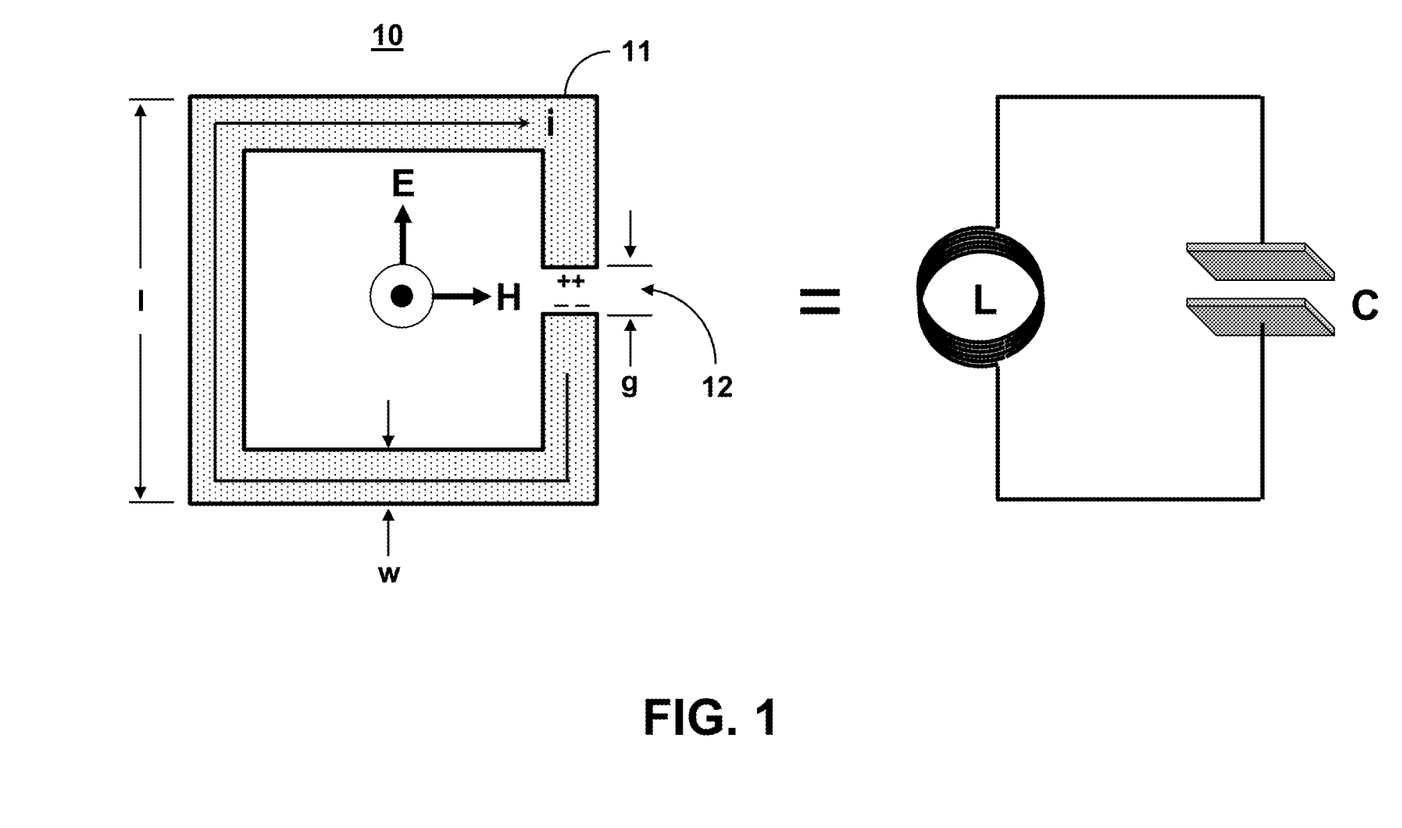
FIG. 1 is a schematic illustration of a simple split-ring resonator comprising a planar metallic ring with a gap.

However, in the late 90s, Pendry proposed a practical split-ring resonator (SRR) structure that can be used to achieve a negative permeability in the vicinity of a magnetic resonance frequency. See J. B. Pendry et al. *IEEE Trans. Microwave Theory Tech.* 47, 2075 (1999). When combined with continuous wires, one can simultaneously obtain a negative permittivity and a negative permeability, thereby exhibiting a left-handed index of refraction. See D. R. Smith et al., *Phys. Rev. Lett* 84(19), 4184 (2000). As shown in FIG. 1, the simplest form of the SRR 10 is planar metallic ring 11 with a gap 12. The ring 11 has an outer dimension l and a metal linewidth w. The gap 12 has a width g. In essence, the SRR 10 is a small LC circuit consisting of an inductance L and a capacitance C. The ring 11 forms one winding of a coil (the inductance), and the ends form the plates of a capacitor. Electromagnetic radiation directed into the plane of the SRR induces a ring current i in the ring. Metamaterials comprise an array of such subwavelength metallic resonator structures within or on an electrically insulating or semiconducting substrate. Dense packing of SRRs, using lattice constants smaller than the LC resonance wavelength, creates a metamaterial that can exhibit a magnetic and electric resonance at the resonant frequency $\omega_{LC}=1/\sqrt{LC}$. Two resonances are observed when exciting the SRR structure shown with incident radiation having polarization perpendicular to the gap (i.e., electric field E parallel to the arm containing the gap, as shown). The LC resonance corresponding to the ring current leads to a magnetic dipole moment perpendicular to the SRR plane and an electric dipole moment parallel to the incident electric field. A shorter wavelength Mie resonance is also excited, corresponding to an electric dipole oscillating in the arm opposite the gap. With incident radiation polarized parallel to the gap, only a Mie resonance corresponding to electric dipoles oscillating in the two arms parallel to the gap is observed. The resonances can be strengthened by adding additional, concentric rings, each ring having a gap, to the simple SRR structure. Other resonant structures can also be designed and implemented.

In addition, the resonator response is scalable from radio to optical frequencies. See D. R. Smith et al., *Phys. Rev. Lett.* 84, 4184 (2000); J. B. Pendry et al., *Science* 312, 1780 (2006); R. A. Shelby et al., *Science* 292, 77 (2001); and C. Enkrich et al., *Phys. Rev. Lett.* 95, 203901 (2005). For the simple SRR described above, both the inductance and capacitance scale proportionally to SRR size, provided that all SRR dimensions are scaled down simultaneously and that the metal retains a high conductivity. Therefore, the resonant frequency scales inversely with a normalized size (or scale factor, S), according to $\omega_{LC} \propto 1/s$. Therefore, metamaterials have the potential to provide a scale-invariant design paradigm to create functional materials which can enhance our ability to manipulate, control, and detect electromagnetic radiation. The recent growth in the field of metamaterials is partly due to the promise of new devices that exploit these novel electromagnetic properties in all frequency ranges, including terahertz. See B. Ferguson and X-C Zhang, *Nature Materials* 1, 26 (2002); M. C. K. Witshire et al., *Science* 291, 849 (2001); T. J. Yen et al., *Science* 303, 1494 (2004); and W. J. Padilla et al., *Phys. Rev. Lett.* 96, 107401 (2006).

However, such resonant structures can have losses which limit their performance, some of which are radiation losses and dielectric losses due to the substrate. Reducing dielectric losses in THz metamaterials would allow for improved terahertz devices that could be used in some of these applications. In addition, most metamaterial structures are planar and, therefore, highly anisotropic. Some of these device applications require the fabrication of three-dimensional (3D) metamaterials. However, fabricating 3D metamaterials is a challenge at terahertz and shorter wavelengths due to fabrication constraints.

Therefore, a need remains for microfabricated metamaterials that exhibit lower losses and that can be assembled into three-dimensional structures that enable full coupling of incident electromagnetic terahertz radiation in two or three orthogonal directions. Furthermore, due to the limited technology available for manipulation and control of terahertz radiation, there is a need for polarization sensitive and insensitive metamaterials at these frequencies that can enable new devices and applications. The ability to detect and control terahertz polarization with metamaterials would enable novel terahertz polarimetric devices.

SUMMARY OF THE INVENTION

The present invention is directed to metamaterials, comprising an electrically insulating or semiconducting substrate and a periodic array of resonator elements disposed on the substrate, wherein the resonator elements have a structure that provides a tunable magnetic permeability or a tunable electric permittivity for incident electromagnetic radiation at a frequency of greater than 100 GHz and the periodic array has a lattice constant that is smaller than the wavelength of the incident electromagnetic radiation. The magnetic permeability and electric permittivity can be negative simultaneously. The metamaterials can be fabricated on large-area, free-standing thin dielectric membrane (e.g., silicon nitride) to reduce dielectric losses and enable flexible and conformable designs.

The resonator elements depend on a specific application but can comprise any of the structures known in the art, or a circular split-ring resonator or an elliptical split-ring resonator of the type described hereinafter. Most metamaterials have a resonant response that is sensitive to polarization. Alternatively, the metamaterial can be insensitive to polarization. Both are spectrally selective and can provide for different, maybe complementary, applications. In particular, if the desired application requires a polarization insensitive device, the circular split-ring resonator can be used. Alternatively, if the application requires a polarization sensitive device, the elliptical ring resonator can be used.

Metamaterials on thin membranes can be practical and useful for implementing fully three-dimensional metamaterial structures across the electromagnetic spectrum. The dielectric membrane can be disposed on non-planar substrate to provide a 3D metamaterial. Alternatively, layers of metamaterial membranes can be stacked in a plane parallel or other stacking geometry. Depending on the application, the resonator elements of the stacked layers may or may not have the same structure and periodicity.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

The present invention is directed toward terahertz metamaterials comprising a periodic array of resonator elements on a dielectric substrate. The dielectric substrate can comprise a thin dielectric membrane. Therefore, the present invention is further directed toward a method to fabricate such terahertz metamaterials on a thin membrane. Fabrication of such metamaterials on a membrane enables the fabrication of three-dimensional terahertz metamaterials.

Fabrication of Planar Metamaterials on Thin Membranes

As schematically illustrated in FIG. 2, a method of the present invention is directed toward the fabrication of metamaterials on thin membranes. As an example of the fabrication method, the THz metamaterials can be fabricated on large area, free-standing thin silicon nitride ($Si_3N_4$) membranes as further described below. Fabricating metamaterials on thin membranes reduces any dielectric losses due to the substrate and enables the implementation of various planar stacking schemes. In addition, fabrication of planar metamaterials on thin membranes enables the metamaterial-covered membrane to be released from the substrate and wrapped over curved surfaces, thereby enabling the fabrication of arbitrarily curved 3D metamaterials.

Figure 2A:
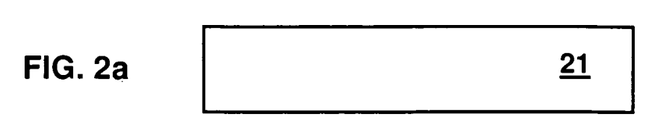
FIG. 2 is a schematic illustration of a method to fabricate terahertz metamaterials on thin membranes.
Figure 2B:
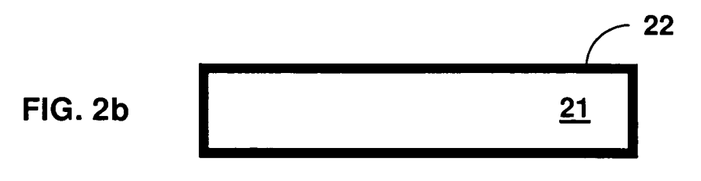
Figure 2C:
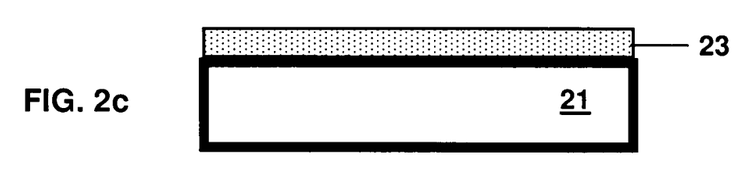
Figure 2D:
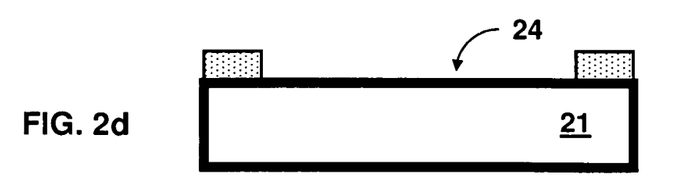
Figure 2E:
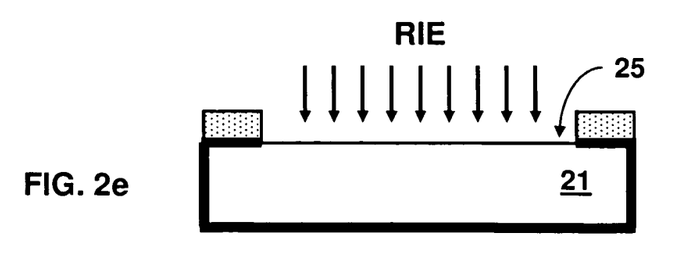

As shown in FIG. 2a, a standard wafer 21 is provided. As shown in FIG. 2b, the wafer 21 can be coated with a conformal layer of thin membrane material 22. The membrane should be thick enough to maintain continuity across the exposed area and also enable manipulation. In particular, for 3D metamaterials the membrane should be thin enough so that it doesn't break apart when bent. The membrane should be electrically insulating. Generally, the membrane material will be chemically inert, although chemical specificity can be desirable for sensing applications. Examples of wafer/membrane combinations comprise silicon/silicon nitride and gallium arsenide/silicon dioxide. Other suitable polymer-based materials comprise MYLAR® polyester film or KAPTON® polyimide film. If the membrane layer coats all sides of the substrate, it can be removed from a back side of the wafer to form the thin membrane on the other side for deposition of the metamaterial resonator elements thereon. As shown in FIG. 2c, a photoresist layer 23 can be spin-coated on the back side of the membrane-coated wafer. As shown in FIG. 2d, a window 24 can then be opened in the photoresist to expose the underlying membrane layer. As shown in FIG. 2e, the exposed membrane layer can then be removed using physical or chemical etching to expose the back-side surface 25 of the underlying substrate material 21 to be later removed from the back side of the membrane layer.

For example, the wafer can be a standard, 550-μm thick 4" silicon (Si) wafer. The membrane layer can be a 1-μm thick layer of silicon nitride ($Si_3N_4$) deposited on the silicon wafer by plasma-enhanced chemical vapor deposition (PECVD). Since PECVD coats all sides of the wafer, a $Si_3N_4$ window can be defined in JSR 5740 photoresist on the back side of the wafer using standard photolithography. The 1-μm $Si_3N_4$ layer can be removed in the window using reactive ion etching (RIE) in a $CF_4$ and $O_2$ atmosphere.

Figure 2F:
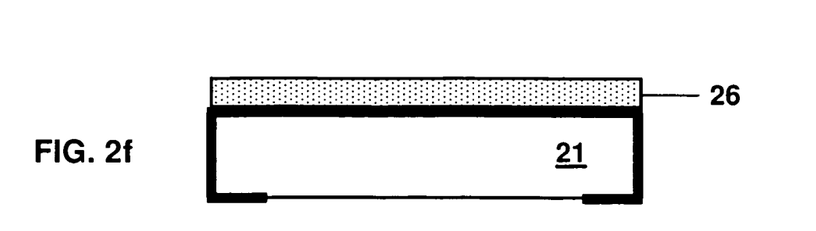
Figure 2G:
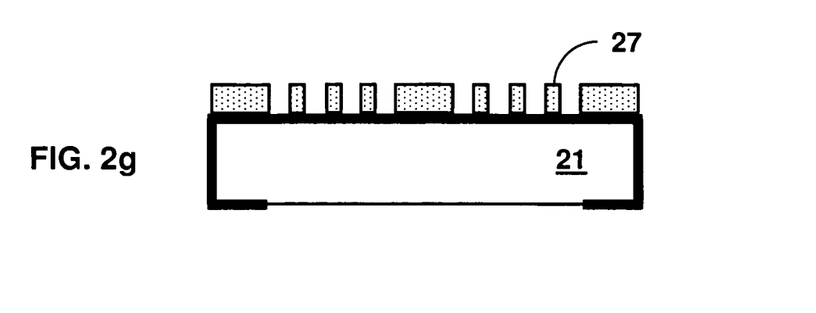
Figure 2H:
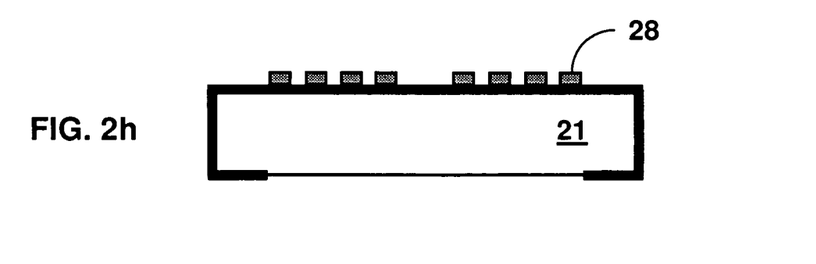
Figure 2I:
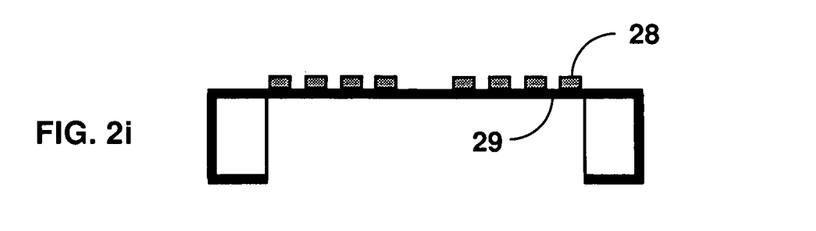

As shown in FIG. 2f, once the window is opened in the membrane layer on the back side of the wafer, the wafer can be flipped over and another photoresist layer 26 can be spin-coated on the front, membrane-side of the wafer. As shown in FIG. 2g, the photoresist can then be patterned. The metamaterial can then be blanket-deposited on the patterned photoresist 27. For terahertz applications, the metamaterial can be fabricated out of metals. For example, the metamaterial can comprise metals such as gold, silver, copper, aluminum, or lead. The metal layer should preferably be thicker than the skin depth of the metal at the frequencies of operation. The metal can comprise a single layer which adheres to the membrane. Alternatively, an adhesion layer can be deposited followed by one or more layers of other metals. As shown in FIG. 2h, the photoresist can be removed with a lift-off process to leave a patterned metamaterial comprising a periodic array of resonator elements 28. The size and the periodicity of the resonators determine the resonant frequency. Finally, as shown in FIG. 2i, the wafer can be mounted in a wafer holder (not shown) that protects the patterned front side and the silicon underlying the membrane layer can be removed to provide the metamaterial resonator elements 28 on a free-standing thin membrane 29.

For example, once the $Si_3N_4$ is removed to form the window on the back side, the wafer can be flipped over and the metamaterial can be patterned in AR® 5214 photoresist by evaporating 200 Å of Ti followed by 500 Å of Au onto the patterned photoresist. After liftoff, the wafer can be flipped over once more and mounted into a commercial wafer holder to protect the front side during the wafer-etching step. A KOH bath at 30% dilution for 6 to 8 h at 80 C can be used to selectively remove the Si substrate in the $Si_3N_4$-free window area defined on the back side and stop at the $Si_3N_4$ membrane layer. After removal from the wafer holder, this method provides the resonator structures patterned on a thin $Si_3N_4$ membrane window.

In general, a metamaterial unit can comprise any combination of ring-like structures with one or multiple splits or wire-like structures in some connected arrangement. The metamaterial can comprise any of the resonator elements published in the literature, ranging from single split-ring resonators and electric resonators to spirals and swastikas, or other structures disclosed herein. A unit cell can comprise one or more resonator elements. A unit cell can comprise a plurality of resonator elements arranged in a symmetric or asymmetric geometry. The resonator elements can be arranged within the plane in a square pattern, in a rectangular pattern, in a random pattern or anything in between. For metamaterial arrays that operate in the terahertz range, the resonator size can be between about 20-60 μm, the gap size can be about 1-4 μm, the metal line width can be about 4-6 μm, and the periodicity (lattice constant) can be about 40-80 μm. For metamaterial structures that operate in the infrared (e.g., frequencies up to about 300 THz), the lattice constant can be as small as 0.4 μm.

Characterization of Planar Metamaterials on Thin Membranes

The electromagnetic response of metamaterials was characterized with a terahertz time-domain spectroscopy (THz-TDS) system. For these characterizations, fifteen arrays of different resonator element structures were patterned onto four large-area, free-standing, thin $Si_3N_4$ windows, each window having an area of 3.2×2.4 $cm^2$. Each window had four different metamaterial structures, each array covering a 1.3×1 $cm^2$ area in the window. One section in one window was intentionally left blank to be used as a reference. The THz-TDS system was based on photolithographically defined photoconductive antennas for both the source and the detector. See J. F. O'Hara et al., *Appl. Phys. Letts.* 88(25), 251119 (2006). The characterizations were performed at room temperature in a dry air atmosphere (<1% humidity). The THz beam diameter was about 3 mm and was easily contained within a window covered by a particular metamaterial array. The time-varying electric fields of the THz waves transmitted through the unpatterned section of the $Si_3N_4$ membrane and through the metamaterial arrays were recorded and, after a numerical Fourier transformation, the THz transmission spectra and the phase change relative to the reference were obtained. In all cases, the THz radiation was polarized perpendicular to the gaps and transmitted normally through the plane of the metamaterials.

Figure 3:
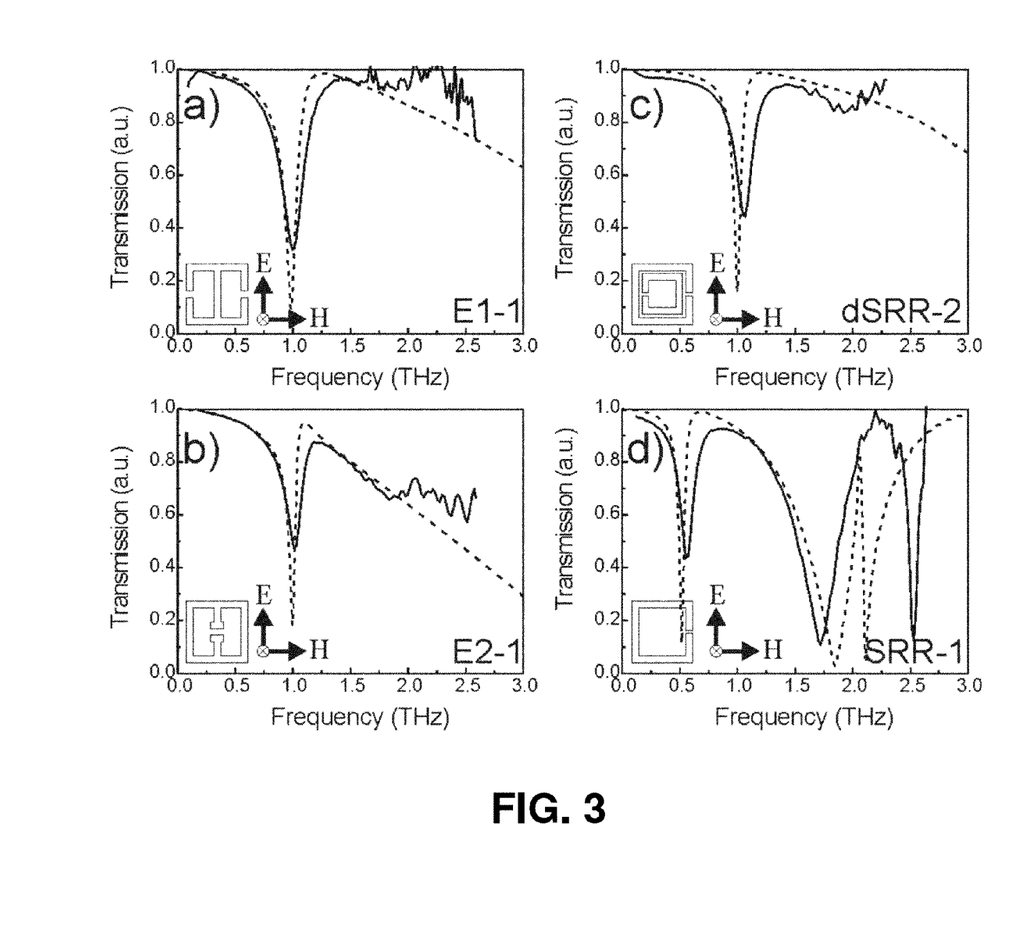
FIG. 3 are graphs of transmission spectra (solid) and simulation results (dash) for a) electric resonator (E1) array, b) electric resonator (E2) array, c) double split-ring resonator (dSRR) array and d) split-ring resonator (SRR) array on planar membranes. The labels refer to designs indicated in Table I.
Figure 4:
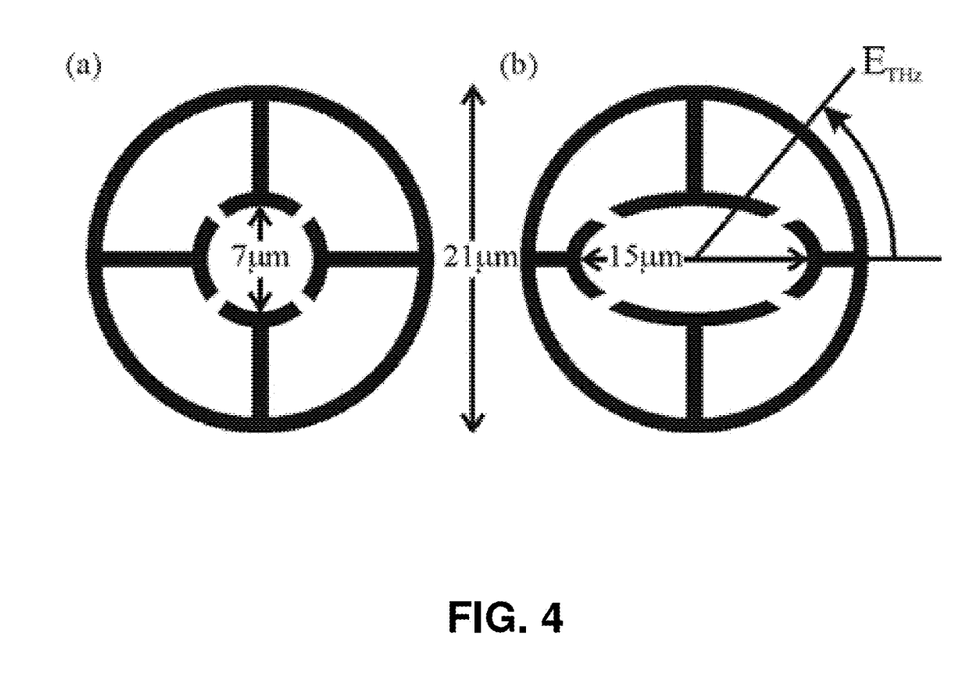
FIG. 4 is a schematic illustration of a metamaterial unit cell for (a) circular split-ring resonator (CSRR) and (b) elliptical split-ring resonator (ESRR). In this example, the gaps and the metal line thicknesses are 2 μm and the period is 60 μm. Angular orientation of the electric field vector of the THz radiation relative to the major axis of the ellipse (horizontal axis of the circle) is indicated in (b).

Electromagnetic modeling was performed using a finite-element code. A constant dielectric permittivity of $\epsilon_{silicon\ nitride}=7$ was used in the simulations. A Drude model was used for the metal's response. Using only Au instead of Ti/Au in the model gave nominally the same results. FIGS. 3 a)-d) show the transmission spectra and simulation results for four representative metamaterial resonator structures. The observed differences between measurements and simulations might be due to the use of a constant dielectric permittivity in the simulations in place of a frequency dependent permittivity, which was not available in the THz region as well as small imperfections on the fabricated samples compared to the ideal resonators used in the simulation. Modeling differed the most from the experiments for the higher frequency resonances in SRR-1 (FIG. 4d)). This might be due to the effect of higher-order modes. See J. F. O'Hara et al., *J. Nanoelect. Optoelectron.* 2, 90 (2007).

Table I lists the geometrical parameters and quality factors (Q) of some of the resonators fabricated on thin $Si_3N_4$ membranes (in bold) as well as physically similar ones found in the literature fabricated on thick substrates. For all low-frequency resonances, Q was calculated as:

$$Q = \frac{\omega_0}{\Delta\omega}$$

where $\omega_0$ is the resonant frequency and $\Delta\omega$ is the full width at half maximum of the resonant response. The geometrical parameters are: g—gap, w—metal linewidth, s—separation between rings (dSRR) or capacitor plate width (E2), l—outer dimension, p—lattice constant. The first seven samples where chosen because the geometrical parameters of these metamaterial structures and those found in the literature are very similar. The last four were chosen on the basis of having very similar low-frequency resonance positions (0.9 THz dSRR and 0.5 THz SRR, see FIG. 3).

TABLE I

Geometrical parameters and quality factors. All lengths are in μm.

| Design | Ref. | g | w | s | l | p | Substrate | Thickness | Metal | Thickness | Q |
|---|---|---|---|---|---|---|---|---|---|---|---|
| E1 | 1 | 2 | 4 | | 36 | 50 | SI GaAs | 670 μm | Ti/Au | 210 nm | 6.0 |
| E1-1 | | 2 | 4 | | 36 | 50 | $Si_3N_4$ | 1 μm | Ti/Au | 70 nm | 4.5 |
| E2 | 1 | 2 | 4 | | 36 | 50 | SI GaAs | 670 μm | Ti/Au | 210 nm | 7.0 |
| E2-1 | | 2 | 4 | 18 | 38 | 50 | $Si_3N_4$ | 1 μm | Ti/Au | 70 nm | 6.4 |
| dSRR | 2 | 2 | 6 | 3 | 36 | 50 | Silicon | 640 μm | Al | 200 nm | 7.6 |
| | 2 | 2 | 6 | 3 | 36 | 50 | Quartz | 1.03 mm | Al | 200 nm | 8.0 |
| dSRR-1 | | 2 | 6 | 3 | 38 | 52 | $Si_3N_4$ | 1 μm | Ti/Au | 70 nm | 7.3 |
| | 3 | 4 | 4 | 3 | 30 | 44 | Quartz | 0.8 mm | Cu | 320 nm | 6.3 |
| dSRR-2 | | 2 | 4 | 4 | 29 | 46 | $Si_3N_4$ | 1 μm | Ti/Au | 70 nm | 6.3 |
| SRR | 4 | 2 | 6 | | 36 | 50 | HR GaAs | 670 μm | Cu | 3 μm | 6.2 |
| SRR-1 | | 2 | 4 | | 55 | 75 | $Si_3N_4$ | 1 μm | Ti/Au | 70 nm | 4.4 |

Ref. 1: W. J. Padilla et al., Phys. Rev. B. 75, 041102R (2007);
Ref. 2: A. K. Azad et al., Opt. Lett. 31(5), 634 (2006);
Ref. 3: X.-L. Xu et al., J. Opt. Soc. Am. B 23(6), 1174 (2006);
Ref. 4: W. J. Padilla et al., Phys. Rev. Lett. 96, 10741 (2006).

All of the structures fabricated on $Si_3N_4$ membranes have comparable Q's to similar structures that appear in the literature. This could imply that dielectric losses from the substrate are not substantial. However, the metallization thickness (20 nm Ti/50 nm Au) is less than the skin depth ($\delta$) of the THz radiation (at 1 THz, $\delta Au \sim 75$ nm, $\delta Ti \sim 325$ nm) for the metamaterials fabricated on $Si_3N_4$ membranes, therefore it is not as efficient at screening the field as in other samples in the literature. See M. C. Martin et al., *Conference Proceedings of IEEE IRMMW-THz* 2005, vol. 1, 34-35 (2005).

Polarimetric Terahertz Metamaterials

Polarization sensitive and polarization insensitive terahertz metamaterials can be fabricated. Both metamaterials have spectrally selective transmissions but they have different polarization dependence, making them ideal for different applications. Polarization insensitive metamaterials can find applications in filtering, imaging, and communications. Polarization sensitive metamaterials can be the basis for various THz polarimetric devices, e.g. polarization multiplexers for communications or analyzers, or for devices used to study dichroism in molecules of interest, e.g. molecules whose optical activity changes with environmental cues. Polarization-sensitive, spectrally selective metamaterials can be used to provide polarization multiplexers, waveplates, polarizing beamsplitters, and other polarization-sensitive devices.

A symmetric resonator element, such as a circular split-ring resonator (CSRR), is insensitive to incident polarization. FIG. 4(a) shows a polarization-insensitive CSRR structure with resonances in the THz range. The symmetry of the CSRR can be modified to provide a metamaterial structure that is sensitive to the incident polarization in a predictable manner. FIG. 4(b) shows a polarization-sensitive elliptical split-ring resonator (ESRR) structure that was modified to break symmetry by replacing the inner split circle with a split ellipse. In general, to provide a polarization insensitive metamaterial the unit cell can have four-fold symmetry. See Padilla, Phys. Rev. B 75, 041102R (2007). Having four-fold symmetry is a sufficient condition in two dimensions, but it is not a necessary condition in three dimensions as is evident in one example of a polarization insensitive structure in three dimensions at microwave frequencies. See Baena, *Appl. Phys. Lett.* 88, 134108 (2006).

The present invention is further directed to polarization-sensitive structures, including the ESRR. The polarization sensitivity of the ESRR comes about from modifying the symmetry of the structure. The inner and/or outer rings of the ESRR can be ellipses that enable easy tuning of the polarization sensitivity. Alternatively, squares, rectangles, or other geometries can be used for one or more of the rings to provide an asymmetric resonator element. For comparison of the CSRR to the ESRR, by maintaining the outer circular ring the same lattice constant is maintained in both directions therefore keeping the resonant response within a certain range and so that any changes are due to the geometry of the resonator itself and not to a different periodicity. By replacing the inner circular ring with an ellipse, an asymmetry is introduced between the horizontal and vertical axes, therefore modifying the response to different polarizations. When the polarization is aligned with the major axis of the ellipse, a weaker response (higher frequency) is expected relative to when the polarization is aligned with the minor axis of the ellipse as there are shorter arms supporting the currents between the rings, generating a smaller dipole moment.

Figure 6:
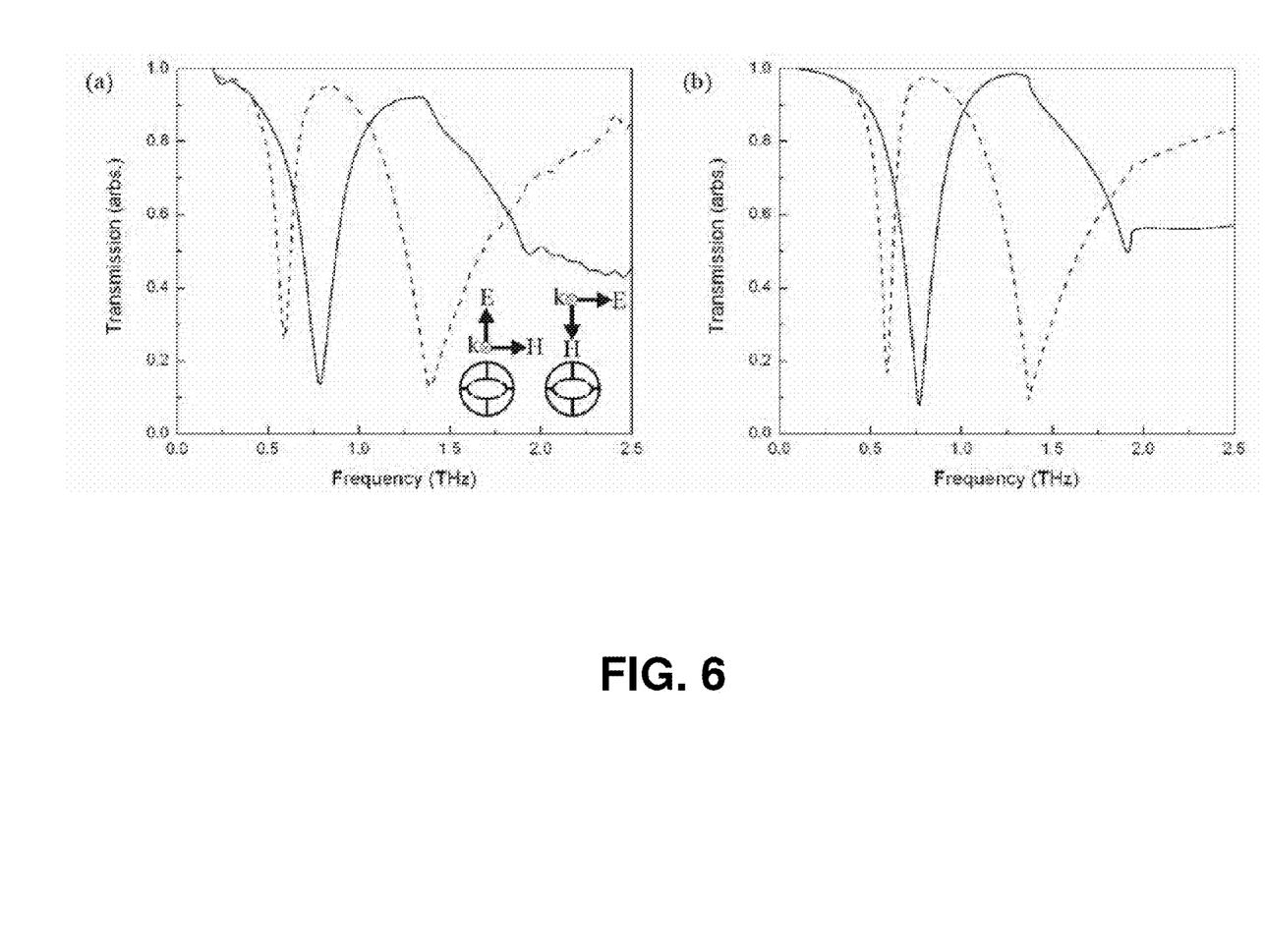
FIG. 6 is a graph of the transmission spectra of the ESSR: (a) experimentally measured and (b) simulation results. Solid lines are at 0 deg and dashed lines are at 90 deg polarization angle as specified in FIG. 4. Inset in (a) indicates the direction of the incident electric field relative to the major axis of the ellipse at 0 (right) and 90 (left) deg.

To evaluate the polarization dependence, both the CSRR and ESRR structures were fabricated simultaneously on semi-insulating GaAs out of 100 Å Ti and 2000 Å Au. Using a THz-TDS system based on photoconductive antennas for both the source and the detector, the transmitted electric field was measured as a function of time and, after a numerical Fourier transformation, the THz transmission spectra and the phase change relative to a blank semi-insulating GaAs wafer were obtained. The transmission was measured as a function of angle between the polarization of the incident THz radiation and the major axis of the ellipse (or the horizontal radius of the circle—see FIG. 4(b)), where the propagation vector remained perpendicular to the plane defined by the metamaterials at all times (see insets in FIG. 6(a)).

Figure 5:
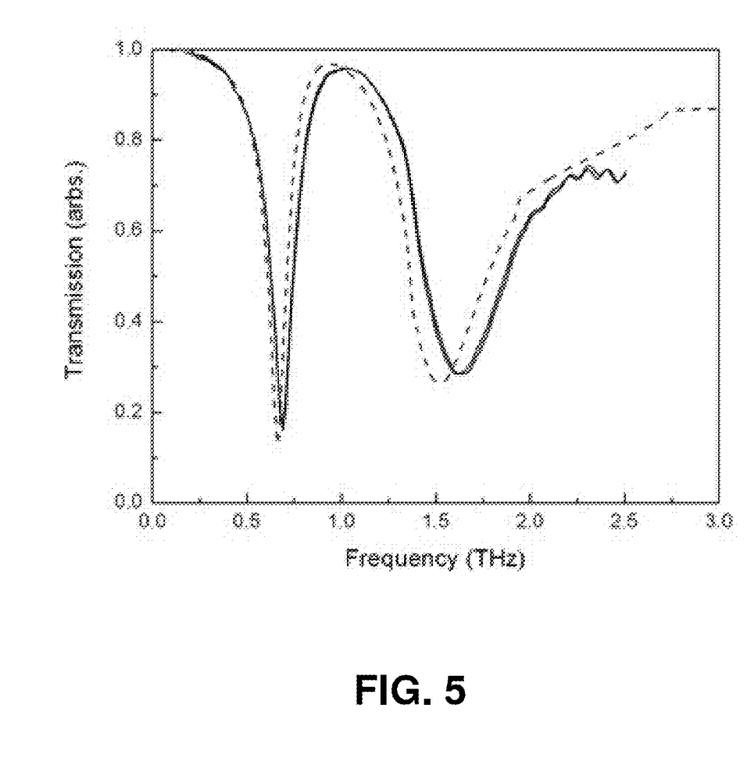
FIG. 5 is a graph of the transmission spectra of the CSSR. Solid lines are the experimental measurements at 0 and 90 deg polarization angle as specified in FIG. 4. Dashed line is the result of the simulation at 0 deg.

FIG. 5 shows the experimentally measured transmission spectra of the CSRR and the result of electromagnetic modeling using a finite-element code. The transmission spectrum is independent of the polarization angle relative to the horizontal and presents two minima, at 0.69 and 1.64 THz. The modeling results differ slightly from the experimental results when comparing the resonance amplitude and position. The simulations provide the electric field and surface current density distributions at resonance, allowing the lower frequency resonance to be assigned mostly to circulating currents in the outer ring and charge accumulation at the gaps, i.e., an inductive-capacitive (LC) resonance in nature, and the higher frequency resonance to higher order electric response (e.g., dipole-like, quadrupole-like, etc.). Having such a spectrally selective transmission in a polarization insensitive metamaterial makes it ideal for filtering applications as alignment with a linearly polarized source is not an issue and it can be used with elliptically polarized sources as well.

FIG. 6(a) shows the experimentally measured transmission spectra of the ESRR. When the incident polarization is parallel to the major axis of the ellipse, i.e., 0 deg, there are two minima occurring at 0.79 and 1.94 THz. When the incident polarization is perpendicular to the major axis of the ellipse, i.e., 90 deg, the minima are found at 0.59 and 1.39 THz. FIG. 6(b) shows the results of electromagnetic modeling of the transmission spectra. The modeling shows good agreement with the experiments in terms of the resonance amplitude and position. Simulation results allow the resonance at 0.79 THz to be attributed mainly to an LC resonance and the resonance at 1.39 THz mainly to a higher-order electric resonance.

Three-dimensional Terahertz Metamaterials

Some THz applications require the fabrication of three-dimensional metamaterials. Three-dimensional metamaterials can be fabricated by stacking individual layers, by creating arbitrarily curved surfaces, or a combination of both. Fabricating the metamaterials on thin membranes enables the metamaterial-covered membranes to be released and draped over a range of curved surfaces, thereby enabling a means to fabricated arbitrarily curved 3D metamaterials. To demonstrate a 3D THz metamaterial of the present invention, metamaterials were made out of 200 Å Ti followed by 500 Å Au on 550 µm thick 4" silicon wafers PECVD coated with 1 µm of $Si_3N_4$, using the fabrication method described above. The membrane was patterned into four approximately (3.2× 2.4) $cm^2$ free-standing windows, each window comprising four different resonator arrays per window. The flexibility of the membrane allows it to wrap around a curved substrate without breaking.

Figure 7:
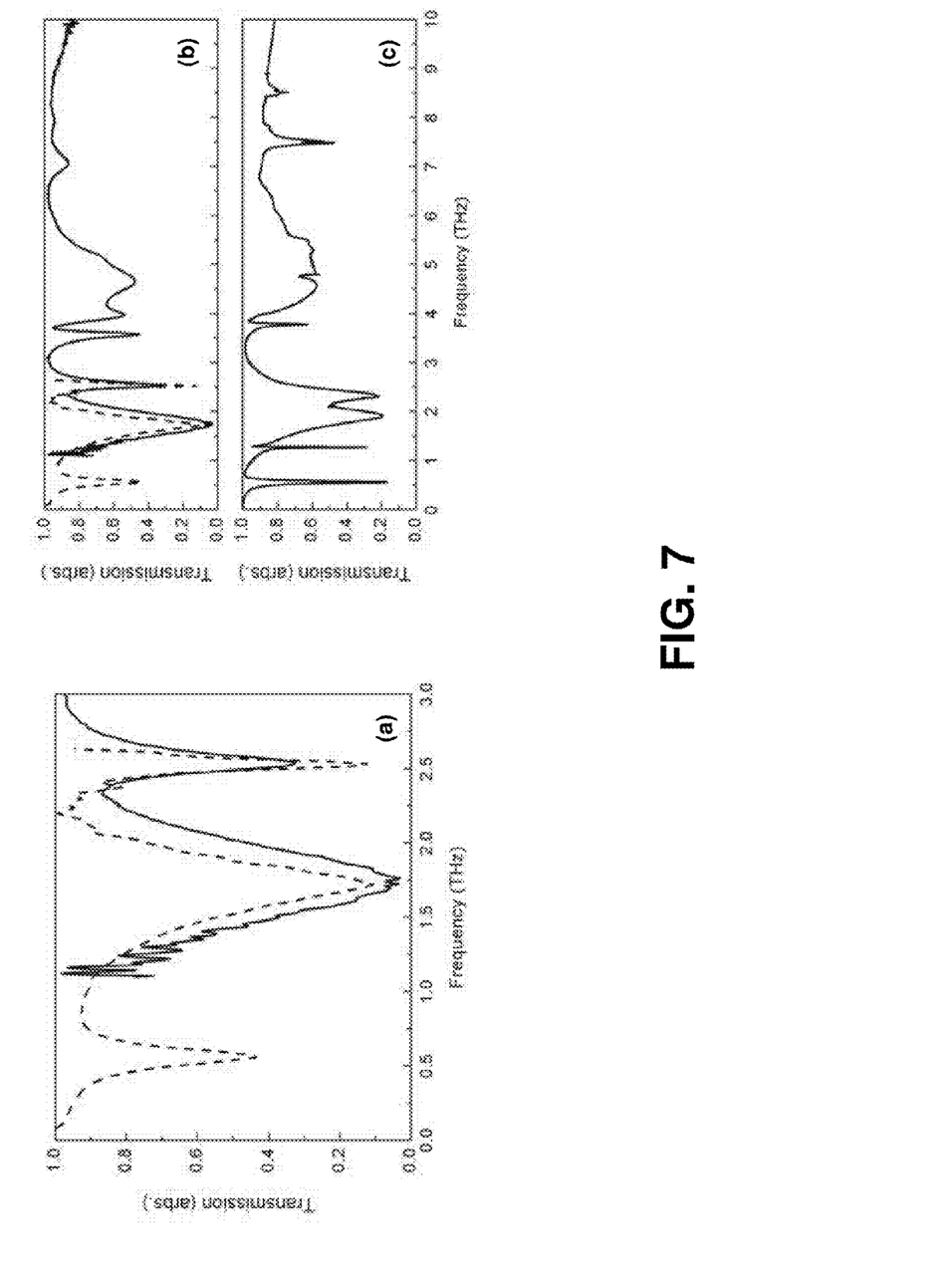
FIG. 7(a) is a graph of experimentally measured lower frequency range transmission spectra of the SSR. Solid (dashed) line was obtained from the FTIR (THz-TDS) measurements.
FIG. 7(b) is a graph of the experimental results for the full frequency range.
FIG. 7(c) is a graph of the simulation results for full frequency range.

One of the resonator arrays comprised SRRs that had a gap, g=2 µm; metal linewidth, w=4 µm; outer dimension, l=55 µm; and lattice constant, p=75 µm. The SRR arrays were characterized before releasing the membranes. Having a thin membrane shifts the Fabry Perot oscillations well outside wavelengths of interest, so that THz-TDS transmission measurements of the SRR array can be complimented with Fourier Transform Infrared Spectrometer (FTIR) measurements. FIGS. 7(a) and 7(b) show transmission spectra from about 0.1 THz up to 10 THz. In both cases, the THz radiation was polarized perpendicular to the gap in the SRR and transmitted normally through the plane of the metamaterial.

Electromagnetic modeling was performed using a finite-element code. FIG. 7(c) shows the results of this modeling for the full range. Most of the features observed in the measurements and their relative positions were reproduced qualitatively by the modeling. The observed differences might be related to the permittivity and loss tangent values used in the simulations. Since these were not available in the THz region, bulk values for $Si_3N_4$ at 9.5 GHz were used. From previous studies, the resonance at 0.5 THz is an inductive-capacitive resonance due to circulating currents in the ring, while the one at 1.75 THz is electrical, due to dipole-like behavior in the two parallel, continuous arms of the rings.

Figure 8A:
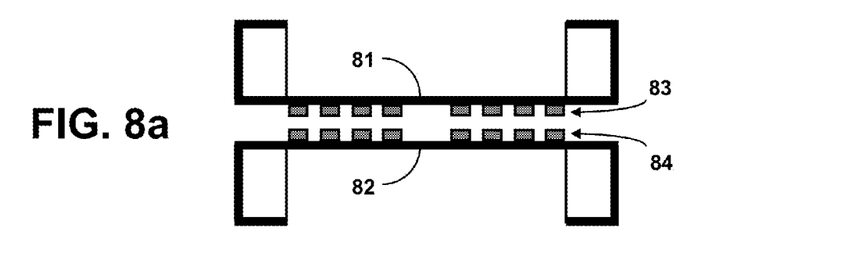
FIG. 8a is a schematic illustration of a three-dimensional metamaterial comprising stacked layers of resonator arrays on thin membranes.

Three-dimensional metamaterials can be fabricated by stacking individual layers. As shown in FIG. 8a, two wafers 81 and 82 with the same or different metamaterial patterns can be fabricated and stacked with the metamaterials 83 and 84 facing each other in a plane parallel geometry. Metamaterial properties can be varied as a function of separation between the layers, registry between the metamaterial structures between the layers, and relative orientation of the structures. See P. Gay-Balmaz and O. J. F. Martin, *J. Appl. Phys.* 92, 2929 (2002); and N. Katsarakis et al., *Opt. Lett.* 30, 1348 (2005). The resonant response of the layered structure will vary depending on the separation between the layers. For the highest quality factor at the resonant frequency of a single layer, the layers can be separated by λ/4, where λ is the resonant wavelength. Smaller separations shift the resonance position to lower frequencies and eventually cause a resonance split. Larger separations decrease the quality factor and cause a small shift to higher frequencies. The registry between the layers is not critical and does not significantly modify the resonant response as long as the relative orientation of polarization sensitive resonators remains the same in the different layers. The relative orientation of the resonators between layers will modify the response by broadening and/or shifting the resonance so this is determined by the particular application and desired response. The wafers can be kept parallel by introducing a spacer of a known thickness around the edges. To extend this stacking scheme to more layers, a thin Si wafer can be used, smaller pieces which can be nested into each other to form a 3D layered structure, or the membranes can be removed from the substrate and stacked with a layer-by-layer stacking process.

Figure 8B:
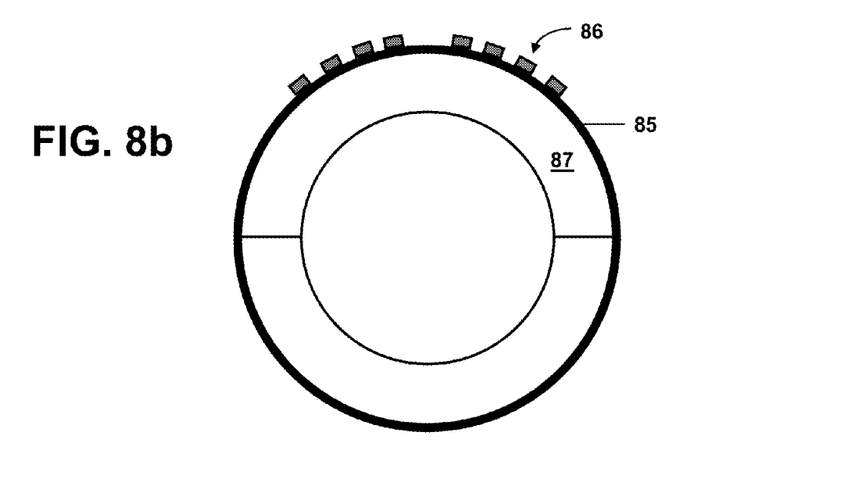
FIG. 8b is a schematic illustration of a three-dimensional metamaterial comprising a resonator array on a thin membrane on a curved surface.

Alternatively, as shown in FIG. 8b, three-dimensional metamaterials can be fabricated by creating arbitrarily curved surfaces. For example, a patterned membrane can be removed from the Si wafer after fabrication. The wafer can be placed front side down onto a stack of lens cleaning paper and, with a sharp razor blade, the $Si_3N_4$ window can be cut out. Using tweezers, the membrane 85 comprising the metamaterial structures 86 can be moved onto a host material or substrate 87 which can be planar, such as a piece of MYLAR® of a known thickness for the stacking method, or a 3D object such as a TEFLON® tube (MYLAR® polyester and TEFLON® polytetrafluoroethylene films are transparent at THz frequencies).

Another method for membrane removal which can be incorporated directly into the fabrication method previously described, is to define a $Si_3N_4$-free trench on the front side of the wafer before any other processing step. The trench can be located at the edge of the $Si_3N_4$-free windows so that in the substrate removal step, the windows can be released from the supporting Si wafer. The electromagnetic response of the metamaterials on a curved surface will depend on the curvature relative to the lattice constant, the wavelength of the incoming radiation, the design of the SRR, and the shape of the incoming wavefronts. The metamaterials and curvature can be designed to interact with the incident radiation modifying its wavefront as it traverses the metamaterials. The substrate can be a passive mechanical support for the metamaterials, virtually transparent to the radiation of interest, or it can play an active role in defining the electromagnetic properties of the metamaterials, such as a gain medium or a substrate whose properties change in response to the presence of some external material or excitation.

Figure 9:
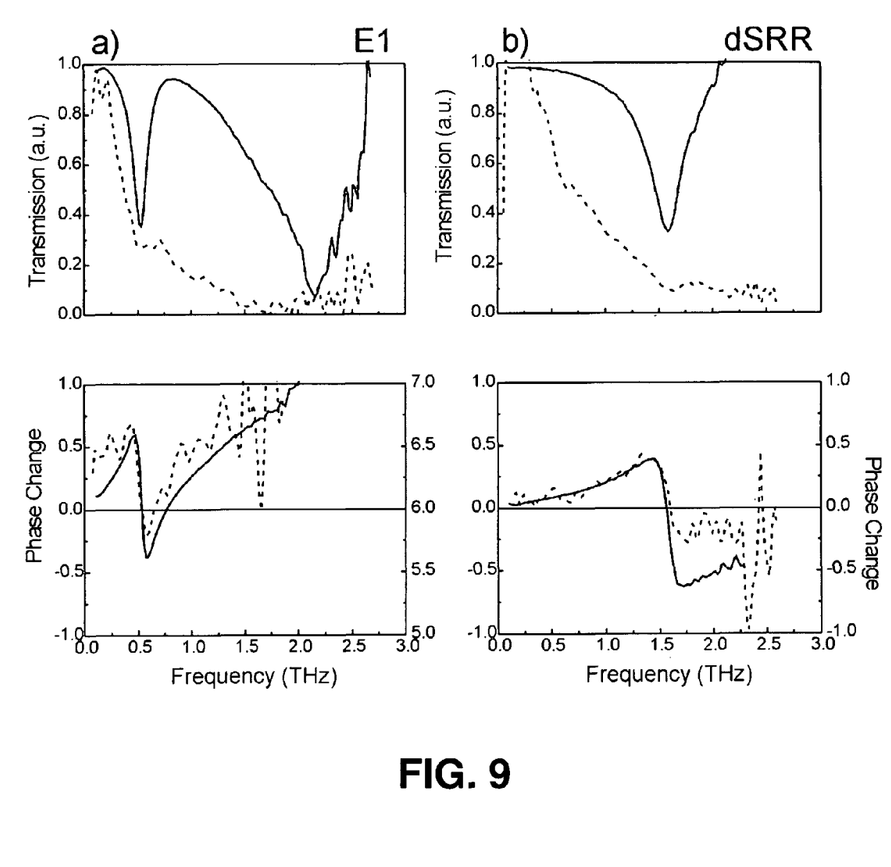
FIG. 9 is a graph of transmission spectra and phase change for a) E1 and b) dSRR on planar (solid) and curved (dash) membranes.

The dashed lines in FIGS. 9a) and 9b) show the frequency-dependent amplitude transmission and the phase change of two different metamaterial designs wrapped around a Teflon tube. The reference was a bare piece of Teflon tube. The solid lines are the response of the corresponding planar metamaterial-covered membranes. In both curved metamaterials, a small decrease in transmission close to the resonance of the planar metamaterials on top of a uniformly decreasing background is observed. The phase change data clearly confirms that the small decrease in transmission is the curved metamaterial's response.

The present invention has been described as a terahertz metamaterial. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A metamaterial, comprising:
   a free-standing dielectric membrane, wherein the thickness of the dielectric membrane is less than one micron; and
   a periodic array of resonator elements disposed on the dielectric membrane, wherein the resonator elements have a structure that provides a tunable magnetic permeability or a tunable electric permittivity for incident electromagnetic radiation at a frequency of greater than 100 GHz and the periodic array has a lattice constant that is smaller than the wavelength of the incident electromagnetic radiation.

2. The metamaterial of claim 1, wherein the periodic array of resonator elements is sensitive to the polarization of the incident electromagnetic radiation.

3. The metamaterial of claim 2, wherein the polarization sensitive periodic array of resonator elements comprises a polarization-sensitive device.

4. The metamaterial of claim 3, wherein the polarization-sensitive device comprises a polarization multiplexer, waveplate, or polarizing beam splitter.

5. The metamaterial of claim 1, wherein the resonator elements comprise a split-ring resonator.

6. The metamaterial of claim 5, wherein the split-ring resonator comprises a symmetric split-ring resonator.

7. The metamaterial of claim 6, wherein the symmetric split-ring resonator comprises a circular split-ring resonator.

8. The metamaterial of claim 5, wherein the split-ring resonator comprises an asymmetric split-ring resonator.

9. The metamaterial of claim 8, wherein the asymmetric split-ring resonator comprises an elliptical split-ring resonator.

10. The metamaterial of claim 1, further comprising:
    at least one additional dielectric membrane; and
    a periodic array of additional resonator elements disposed on the at least one additional dielectric, wherein the additional resonator elements have a structure that provides a tunable magnetic permeability or a tunable electric permittivity for incident electromagnetic radiation at a frequency of greater than 100 GHz and the periodic array has a lattice constant that is smaller than the wavelength of the incident electromagnetic radiation; and
    wherein the dielectric membranes are stacked to provide a three-dimensional metamaterial.

11. The metamaterial of claim 10, wherein the additional resonator elements have a different structure than the resonator elements.

12. The metamaterial of claim 10, wherein the periodic array of additional resonator elements has a different lattice constant than the periodic array of resonator elements.

13. The metamaterial of claim 10, wherein the at least one additional dielectric membrane is planar.

14. The metamaterial of claim 10, wherein the at least one additional dielectric membrane is non-planar.

15. The metamaterial of claim 10, wherein the dielectric membranes are stacked in a plane parallel geometry.

16. The metamaterial of claim 1, wherein the dielectric membrane is non-planar.

17. The metamaterial of claim 16, wherein the dielectric membrane is disposed on a non-planar substrate.

18. The metamaterial of claim 1, wherein the dielectric membrane comprises silicon nitride.

19. The metamaterial of claim 1, wherein the lattice constant is less than 80 microns.

20. The metamaterial of claim 1, wherein the periodic array of resonator elements is insensitive to the polarization of the incident electromagnetic radiation.

21. The metamaterial of claim 1, wherein the dielectric membrane is planar.

22. The metamaterial of claim 1, wherein the dielectric membrane comprises a polymer.

* * * * *